US008201030B2

(12) United States Patent
Bae et al.

(10) Patent No.: US 8,201,030 B2
(45) Date of Patent: Jun. 12, 2012

(54) METHOD AND APPARATUS FOR PARALLEL STRUCTURED LATIN SQUARE INTERLEAVING IN COMMUNICATION SYSTEM

(75) Inventors: Seul-Ki Bae, Seoul (KR); Seung-Hee Han, Hwaseong-si (KR); Jong-Hyeuk Lee, Anyang-si (KR); Hong-Yeop Song, Seoul (KR); Dae-Son Kim, Seoul (KR); Joon-Sung Kim, Seoul (KR)

(73) Assignees: Samsung Electronics Co., Ltd., Suwon-si (KR); Industry-Academic Cooperation Foundation, Yonsei University, Seoul (KR)

( * ) Notice: Subject to any disclaimer, the term of this patent is extended or adjusted under 35 U.S.C. 154(b) by 895 days.

(21) Appl. No.: 12/290,391

(22) Filed: Oct. 30, 2008

(65) Prior Publication Data
US 2009/0113271 A1 Apr. 30, 2009

(30) Foreign Application Priority Data
Oct. 31, 2007 (KR) ........................ 10-2007-0110144

(51) Int. Cl.
*G06F 11/00* (2006.01)
(52) U.S. Cl. ........................ 714/701; 714/776
(58) Field of Classification Search ................. 714/701, 714/776
See application file for complete search history.

(56) References Cited

U.S. PATENT DOCUMENTS
2002/0034269 A1* 3/2002 Demjanenko et al. ........ 375/341
2003/0048206 A1* 3/2003 Gatherer et al. ................. 341/50
2007/0101210 A1* 5/2007 Huang .......................... 714/701

FOREIGN PATENT DOCUMENTS
KR  10-2005-0119595  12/2005
KR  10-2005-0122521  12/2005
KR  10-2007-0085244   8/2007

OTHER PUBLICATIONS

Hyun-Young Oh, Collision-free Interleavers Using Latio Squares for Parallel Decoding of Turbo Codes, Dec. 2006, Graduate School of Yonsei University, pp. 1-63.*
Hyun-Young Oh, "Collision-free Interleavers using Latin Squares for Parallel Decoding of Turbo Codes", The Graduate School Yonsei University, Department of Electrical and Electronic Engineering, Dec. 2006, 63 pages.

* cited by examiner

Primary Examiner — M. Mujtaba K Chaudry

(57) ABSTRACT

A method and apparatus for parallel structured Latin square interleaving in a communication system are provided. The method includes dividing input information bits into sub-blocks according to a parallel processing order, generating a first Latin square matrix or a second Latin square matrix by comparing the parallel processing order with a predetermined threshold, and interleaving by reading out the information bits divided into the sub-blocks according to the generated Latin square matrix.

20 Claims, 8 Drawing Sheets

METHOD AND APPARATUS FOR PARALLEL STRUCTURED LATIN SQUARE INTERLEAVING IN COMMUNICATION SYSTEM

CROSS-REFERENCE TO RELATED APPLICATION(S) AND CLAIM OF PRIORITY

The present application claims the benefit under 35 U.S.C. §119(a) of a Korean patent application filed in the Korean Intellectual Property Office on Oct. 31, 2007 and assigned Serial No. 2007-110144, the entire disclosure of which is hereby incorporated by reference.

TECHNICAL FIELD OF THE INVENTION

The present invention relates to channel encoding in a communication system. More particularly, the present invention relates to a method and apparatus for a parallel structured Latin square interleaving in a communication system.

BACKGROUND OF THE INVENTION

Recently, with high data rates required in mobile communication and wireless data communication, there are greater requirements on communication bandwidth efficiency or reliability. In particular, an error may be detected from digital data due to several factors in the process of transmitting and receiving the digital data, in the process of recording and reading the digital data through a storage medium, or in a process of reproducing multimedia data (i.e., audio or video data). Such an error can be corrected or reduced by using many error control schemes which have been researched up to now. Examples of the error control schemes include a Forward Error Correction (FEC) protocol and an Automatic Repeat reQuest (ARQ) protocol. A turbo code may be used in the FEC. Along with a circular tail-biting coding scheme, researches on a parallel processing technique for turbo codes have actively been conducted.

FIG. 1 is a block diagram illustrating a parallel processing method of a turbo decoder. If a full block size or an interleaver size is N, one block is divided into L sub-blocks and then parallel processing is performed. Each block has a size of M, where M=N/L. Each block receives data information from a memory under the control of individual processors 1 to L. Decoding processes are simultaneously carried out. Each processor receives the data information according to an interleaving rule determined by an interleaver or a de-interleaver.

FIG. 2 is a diagram illustrating an example of a contention occurrence in a decoding process based on parallel processing when a block consists of 4 sub-blocks. As described in FIG. 1 above, each of processors performs interleaving by reading out a data information bit from a corresponding memory according to an interleaving rule. Referring to FIG. 2, two processors (i.e., a processor 1 and a processor 2) simultaneously read out information from a first memory. Since any information can be accessed only by one processor at any one time, the information has to be accessed two times to be read out by the two processors. In this case, a contention may occur, which is indicated by 200 in FIG. 2. The occurrence of contention results in deterioration of efficiency in parallel processing. In order to avoid such a contention, various contention-free interleavers have been proposed.

An Almost Regular Permutation (ARP) interleaver is proposed by Berror. The ARP interleaver may be found in <Document 1: Designing good permutations for turbo codes: towards a single model: C. Berrou, S. Kerouedan, Y. Saouter, C. Douillard, and M. Jezequel, June 2004., in Pro. Int. Conf. Commun., p 341~345>. In comparison with the conventional interleaver, the ARP interleaver further provides irregularity by using a relatively prime property. The ARP interleaver is defined by Equation 1 below:

$$\pi(k)=(P \cdot k+L \cdot (\alpha(k) \cdot P+\beta(k))+\gamma)(\bmod N). \quad \text{[Eqn. 1]}$$

In Equation 1, $\pi(k)$ denotes an interleaving rule of an interleaver and indicates a permutation for reading out data information from a memory by each processor. P and N are relatively prime to one other. L denotes a parallel processing order. $\gamma$ denotes an initial setup value. k satisfies a relation of $0 \leq k \leq N-1$. $\alpha(k)$, and $\beta(k)$ are positive integers having a period of L. In general, $\alpha(k)$ has a value between 0 and 1, and $\beta(k)$ has a value between 0 to 8. The ARP interleaver is adopted by various standards such as Institute of Electrical and Electronics Engineers (IEEE) 802.16, Digital Video Broadcast-Return Channel Satellite (DVB-RCS), Digital Video Broadcast-Return Channel Terrestrial (DVB-RCT), and so forth. In addition, the ARP interleaver is proposed as an interleaver for the 3rd Generation Partnership Project 2 (3GPP2) standard.

An algebraic method is used in a Quadratic Permutation Polynomial (QPP) interleaver which may be found in <Document 2: On Maximum Contention-Free Interleavers and Permutation Polynomials Over Integer Rings: O. Y. Takeshita, March 2006., IEEE Transaction Information Theory, p 1249~1253>. The QPP interleaver is a maximum contention-free interleaver. The QPP interleaver satisfies a contention-free condition with respect to all sub-blocks (that is, N sub-blocks each having a size of M). The QPP interleaver is defined by Equation 2 below:

$$\pi(k)=f_1 \cdot k + f_1 \cdot k^2 (\bmod N). \quad \text{[Eqn. 2]}$$

In Equation 2, $\pi(k)$ denotes an interleaving rule of an interleaver. $f_1$ and $f_2$ are positive integers. The aforementioned <Document 2> may be used as a reference for explaining the requirements on $f_1$ and $f_2$.

In addition, there is an interleaver using a Latin square matrix, wherein the interleaver determines a mixing sequence in each sub-block by using the conventional interleaver having a short length. The Latin square matrix having a size of L×L consists of L different symbols. The respective symbols are presented one by one in all rows and columns. Such a Latin square pattern can be repeated to form an M×L matrix U which represents a Latin square interleaver. The Latin square interleaver is defined by Equation 3 below:

$$\pi(k)=u_{ts} \cdot M + \pi_T(t). \quad \text{[Eqn. 3]}$$

In Equation 3, $\pi(k)$ denotes an interleaving rule of an interleaver. $\pi_T(t)$ denotes a conventional sub-block interleaver. $u_{ts}$ denotes an element of a $t^{th}$ row and an $s^{th}$ column in the matrix U. M denotes a sub-block size. k satisfies a relation of $k=s \cdot M+t$.

A turbo code having a parallel processing structure can be designed in a general system when parallel processing of various orders is possible for various-sized blocks supported in the system. Interleavers proposed to meet such a requirement have to undergo an optimization operation.

In case of the ARP interleaver disclosed in the aforementioned <Document 1> as the conventional technique, the following are taken into account when the optimization operation is performed. It is assumed that the initial setup value $\gamma$ and the value $\alpha$ are determined. If $k(\bmod L)=0$, $\beta(k)$ has a value of 0. Otherwise, if $k(\bmod L) \neq 0$, $\beta(k)$ has a value between 0 to 8. In this case, the number of cases of approximately $|P| \cdot 8L-1$ has to be considered, where $|x|$ denotes a cardinality of x.

In case of the QPP interleaver disclosed in the aforementioned <Document 2> as the conventional technique, there are two design methods according to a block length N. If N is divided by 4, $f_1$ and N are positive integers and are relatively prime to one other. If N is represented as a product of prime numbers, f2 is a positive integer of which elements are the prime numbers. Therefore, the total number of cases is |f1|·|f2|.

In case of the Latin square interleaver, if L=4, a total of 576 cases exists for a 4×4 Latin square matrix. A total of 24 cases exists for a reduced Latin square matrix, in which a first row is fixed to (0,1,2,3). Among the 24 cases, only 12 cases having a good distribution are taken into account. Therefore, the number of cases for the Latin square interleaver is less than that of the interleaver disclosed in the <Document 1> or <Document 2>.

In general, the parallel processing order is 4 for a turbo code having a small or medium block size. For a turbo code having a medium or large block size, the parallel processing order is 8 or 12, which is greater than 4. Table 1 below shows the number of cases to be considered for optimization by each interleaver with respect to 3 cases.

TABLE 1

|  | N = 320, L = 4 | N = 640, L = 4 | N = 1024, L = 8 |
|---|---|---|---|
| ARP interleaver | 40960 | 81920 | 1073741824 |
| QPP interleaver | 15200 | 55360 | 261632 |
| conventional Latin square interleaver | 12 | 12 | 23309006400 |

In Table 1 above, the QPP interleaver considers a relatively less number of cases than the ARP interleaver but considers a significantly larger number of cases than the Latin square interleaver. In case of the Latin square interleaver, if L=4, only 12 cases are considered irrespective of a full block size. Disadvantageously, however, if L=8, the number of cases increases exponentially.

SUMMARY OF THE INVENTION

To address the above-discussed deficiencies of the prior art, it is a primary aspect of the present invention to solve at least the above-mentioned problems and/or disadvantages and to provide at least the advantages described below. Accordingly, an aspect of the present invention is to provide a method and apparatus for a contention-free interleaver having a good throughput while reducing the number of cases for optimization of the interleaver irrespective of a parallel processing order L and a block size N.

In accordance with an aspect of the present invention, an interleaving method using a parallel structured Latin square matrix in a communication system is provided. The method includes dividing input information bits into sub-blocks according to a parallel processing order, generating a first Latin square matrix or a second Latin square matrix by comparing the parallel processing order with a predetermined threshold, and performing interleaving by reading out the information bits divided into the sub-blocks according to the generated Latin square matrix.

In accordance with another aspect of the present invention, an interleaving apparatus using a parallel structured Latin square matrix in a communication system is provided. The apparatus divides input information bits into sub-blocks according to a parallel processing order, generates a first Latin square matrix or a second Latin square matrix by comparing the parallel processing order with a predetermined threshold, and performs interleaving by reading out the information bits divided into the sub-blocks according to the generated Latin square matrix.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF EXEMPLARY EMBODIMENTS

FIGS. 3 through 7B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

Hereinafter, a method and apparatus for performing interleaving by configuring a Latin square matrix while avoiding a memory contention in a wireless communication system will be described. The Latin square matrix is extended from a basic Latin square matrix according to a parallel processing order.

Figure 1:
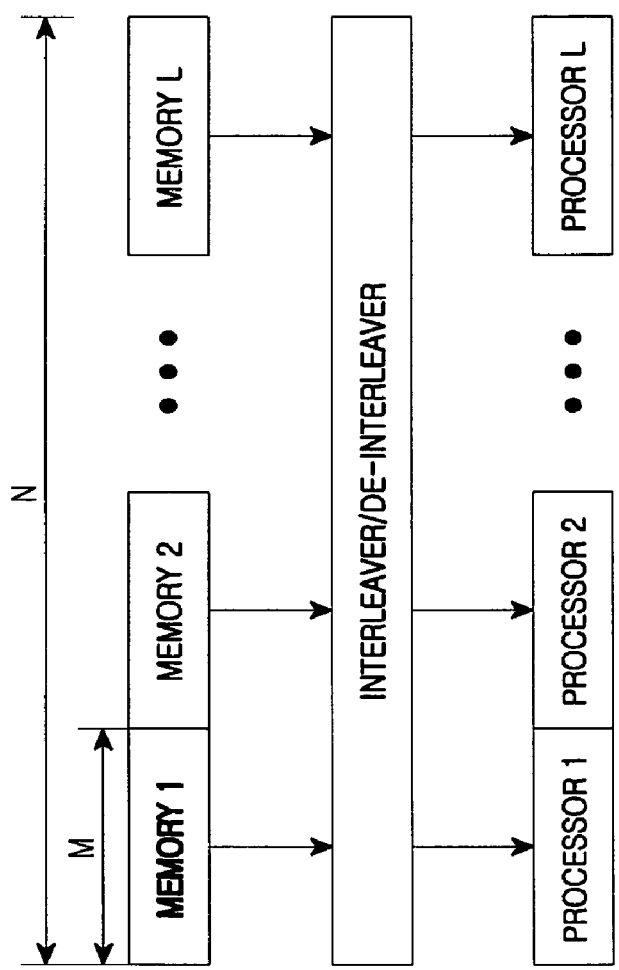
FIG. 1 is a block diagram illustrating a parallel processing method of a turbo decoder.
Figure 2:
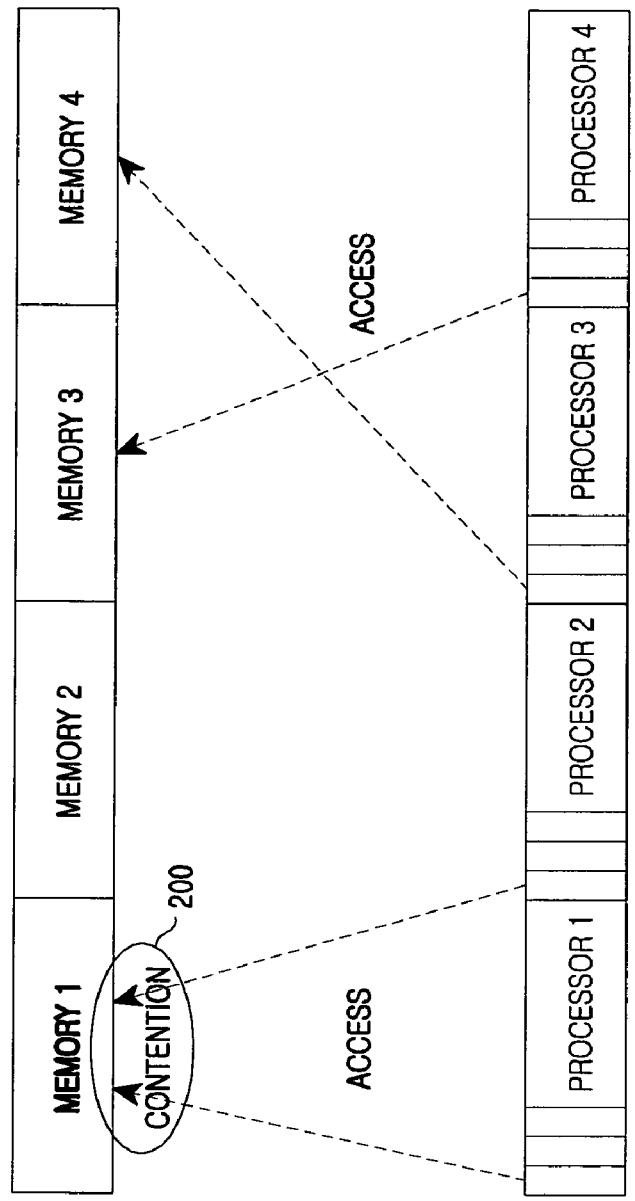
FIG. 2 is a diagram illustrating an example of a contention occurrence in a decoding process based on parallel processing when a block consists of 4 sub-blocks.
Figure 3:
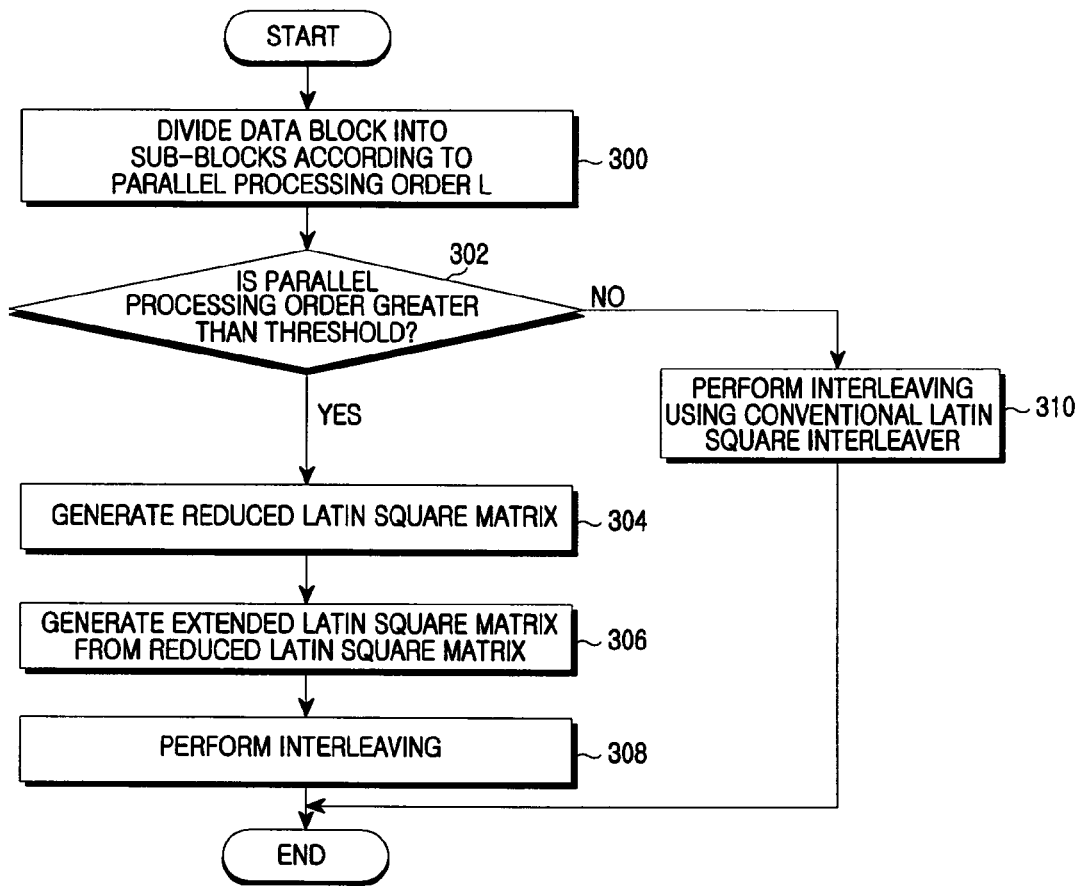
FIG. 3 is a flowchart illustrating a process of performing interleaving using a parallel structured Latin square matrix according to an exemplary embodiment of the present invention.

FIG. 3 is a flowchart illustrating a process of performing interleaving using a parallel structured Latin square matrix according to an exemplary embodiment of the present invention.

Referring to FIG. 3, in step 300, a transmitter divides a full data block N into L sub-blocks according to a parallel processing order L required in the system. Each sub-block has a size of M, where M=N/L.

In step 302, the transmitter determines whether the parallel processing order L is greater than a predetermined threshold. If the parallel processing order L is less than the threshold, proceeding to step 310, the transmitter performs interleaving by using the conventional Latin square interleaver (see the Latin square interleaver disclosed in the Background of the Invention). In the conventional Latin square interleaver, in comparison with other interleavers (i.e., see <Document 1> and <Document 2>), the number of cases for optimization of the interleaver exponentially increases along with the increase in the full data block size N and the parallel processing order L. On the contrary, in comparison with other interleavers (i.e., see <Document 1> and <Document 2>), the number of cases for optimization of the interleaver is significantly small when the parallel processing order L is less than the threshold.

If the parallel processing order L is greater than the threshold in step 302, proceeding to step 304, the transmitter configures an l×l Latin square matrix. Herein, l is a constant less than the parallel processing order L, where L and l are not relatively prime to one other (that is, L is a multiple of l). The Latin square matrix is a matrix in which, when l different elements are arranged in a square form consisting of l rows and l columns, there is no duplicated element in the rows and columns. The l×l Latin square matrix is expressed by Equation 4 below:

$$u_l = \begin{bmatrix} a_{11} & a_{12} & \ldots & a_{1l} \\ a_{21} & a_{22} & & a_{2l} \\ \vdots & & \ddots & \vdots \\ a_{l1} & a_{l2} & \ldots & a_{ll} \end{bmatrix}.$$ [Eqn. 4]

In Equation 4, $u_l$ denotes an l×l Latin square matrix, and $a_{i,j}$ denotes an element of an $i^{th}$ row and a $j^{th}$ column of $u_l$. To reduce the number of cases for optimization of the interleaver, a first row $(a_{11} a_{12} \ldots a_{1l})$ of $u_l$ can be set to $(0\ 1\ 2\ \ldots\ l)$ to form the Latin square matrix, which is called an l×l reduced Latin square matrix. In addition thereto, the l×l Latin square matrix can be configured in various forms.

In step 306, the transmitter generates an extended Latin square matrix by using the l×l Latin square matrix. The basic l×l Latin square matrix of Equation 4 above can be extended to generate the extended Latin square matrix having a size of L=n·l, which is expressed by Equation 5 below. Herein, n denotes a parameter for converting the Latin square matrix $u_l$ into a Latin square matrix $u_L$ having a size required by the system.

$$u_L = (u_l)^{(n)}$$ [Eqn. 5]

$$= \left( \begin{bmatrix} a_{11} & a_{12} & \ldots & a_{1l} \\ a_{21} & a_{22} & & a_{2l} \\ \vdots & & \ddots & \vdots \\ a_{l1} & a_{l2} & \ldots & a_{ll} \end{bmatrix} \right)^{(n)}$$

$$= \begin{bmatrix} a_{11} & \ldots & a_{1l} & a_{11}^{(1)} & \ldots & a_{1l}^{(1)} & \ldots & a_{11}^{(n-1)} & \ldots & a_{1l}^{(n-1)} \\ a_{21}^{(n-1)} & \ldots & a_{2l}^{(n-1)} & a_{21} & \ldots & a_{2l} & \ldots & a_{21}^{(n-2)} & \ldots & a_{2l}^{(n-2)} \\ \vdots & & \vdots & \vdots & & \vdots & \ddots & \vdots & & \vdots \\ a_{11}^{(1)} & \ldots & a_{1l}^{(1)} & a_{11}^{(2)} & \ldots & a_{1l}^{(2)} & \ldots & a_{11} & \ldots & a_{1l} \\ a_{21} & \ldots & a_{2l} & a_{21}^{(1)} & \ldots & a_{2l}^{(1)} & \ldots & a_{21}^{(n-1)} & \ldots & a_{2l}^{(n-1)} \\ \vdots & & \vdots & \vdots & & \vdots & \ddots & \vdots & & \vdots \\ \vdots & & \vdots & \vdots & & \vdots & \ddots & \vdots & & \vdots \\ a_{11}^{(n-1)} & \ldots & a_{1l}^{(n-1)} & a_{11} & \ldots & a_{1l} & \ldots & a_{11}^{(n-2)} & \ldots & a_{1l}^{(n-2)} \\ a_{21}^{(n-2)} & \ldots & a_{2l}^{(n-2)} & a_{21}^{(n-1)} & \ldots & a_{2l}^{(n-1)} & \ldots & a_{21}^{(n-3)} & \ldots & a_{2l}^{(n-3)} \\ \vdots & & \vdots & \vdots & & \vdots & \ddots & \vdots & & \vdots \end{bmatrix}$$

In Equation 5, when $u_l$ is an l×l Latin square matrix, $(u_l)^{(n)}$ is extended into $u_{n\cdot l}$ which is an extended Latin square matrix. Herein, $a_{ij}^{(k)} = a_{ij} + l \cdot k$ and $0 \leq k \leq n-1$. The L×L matrix extended according to Equation 5 above has a form in which L different symbols are transposed in every row and column, thereby forming a Latin square matrix. If $u_l$ has a reduced format, $u_L$ also has a reduced format. Details thereof will be described below with reference to FIG. 4.

In step 308, the transmitter performs full interleaving by combining interleaving results in each sub-block unit by the use of the extended Latin square matrix.

Thereafter, the procedure of FIG. 3 ends.

As described above with reference to FIG. 3, in a method of designing a Latin square interleaver of the present invention, when a parallel processing order required by the system is high, Latin square matrixes having a size required by the system are generated by extending a basic Latin square matrix having a small size. In addition, Latin square interleavers are configured using the generated extended Latin square matrixes to select an interleaver that provides an optimal throughout. In the case of a sub-block interleaver, the conventional interleaver can be used, if necessary, with modification.

Figure 4:
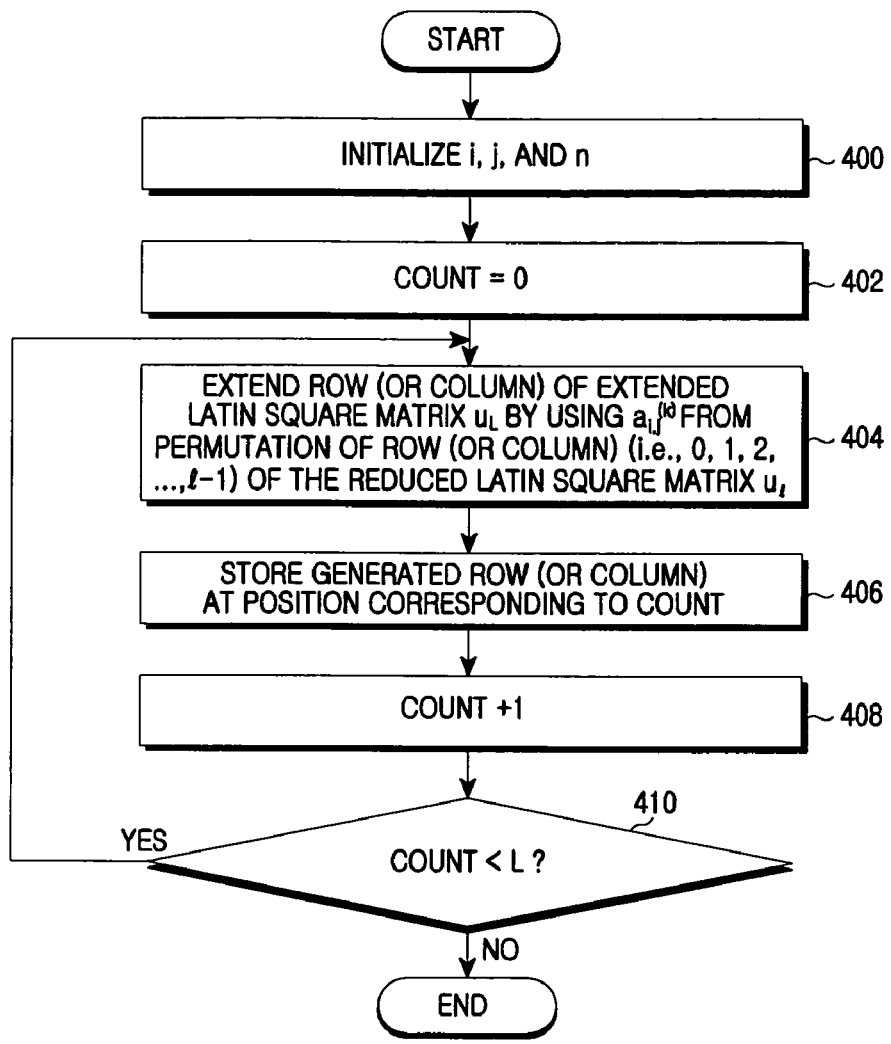
FIG. 4 is a flowchart illustrating a process of configuring an extended Latin square matrix from a basic Latin square matrix according to an exemplary embodiment of the present invention.

FIG. 4 is a flowchart illustrating a process of configuring an extended Latin square matrix from a basic Latin square matrix according to an exemplary embodiment of the present invention.

Referring to FIG. 4, an interleaver initializes values i, j, and n in step 400. The value i is a time index. The value j is a parallel processing index. The value n is a parameter for converting a reduced Latin square matrix into a new Latin square matrix having a size required by the system. According to embodiments, the value j may be defined as the time index, and the value i may be defined as the parallel processing index.

In step 402, the interleaver initializes a counter to 0. The counter is used to perform an operation by the number of times corresponding to a size of the row (or column) of the Latin square matrix required by the system.

In step 404, the interleaver extends the row (or column) of the extended Latin square matrix $u_L$ by using $a_{ij}^{(k)} = a_{ij} + l \cdot k$ from a permutation of a row (or column) (i.e., 0, 1, 2, ..., l−1) of the reduced Latin square matrix $u_l$. Herein, k satisfies a relation of $0 \leq k \leq n-1$.

Figure 5:
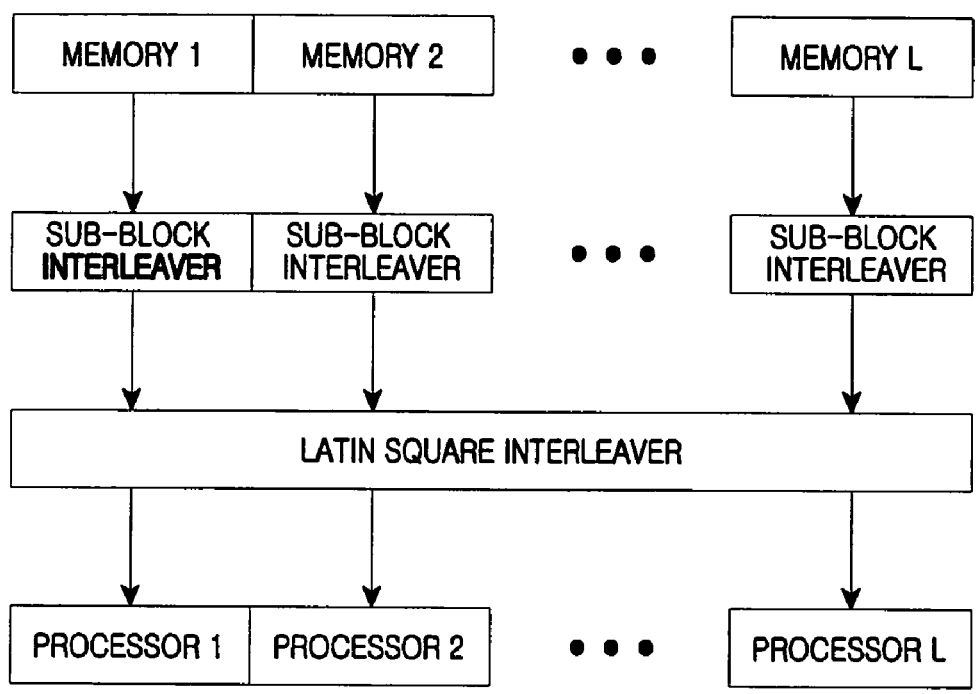
FIG. 5 is a block diagram illustrating an apparatus for performing parallel structured interleaving according to an exemplary embodiment of the present invention.

For example, a first row $(a_{11}\ a_{12}\ \ldots\ a_{1l})$ of the l×l Latin square matrix of Equation 4 is extended to the first row $(a_{11}\ a_{12}\ \ldots\ a_{1l}\ a_{11}^{(1)}\ a_{12}^{(1)}\ \ldots\ a_{1l}^{(1)}\ a_{11}^{(2)}\ a_{12}^{(2)}\ \ldots\ a_{1l}^{(2)}\ \ldots\ a_{11}^{(n)}\ a_{12}^{(n)}\ \ldots\ a_{1l}^{(n)})$ of the L×L Latin square matrix of FIG. 5. Likewise, second to $L^{th}$ rows are also extended according to Equation 5.

In step 406, the interleaver stores the generated row (or column) at a position corresponding to the count.

In step 408, the interleaver increments the count value. In step 410, the interleaver determines whether the count value is less than a parallel processing order L. If the count value is greater than the parallel processing order L, the procedure ends. Otherwise, if the count value is less than the parallel processing order L, returning to step 404, steps 404 to 410 are repeated by the number of times corresponding to the size of the row (or column) of the Latin square matrix required by the system. By repeating steps 404 to 408 according to the parallel processing order L, the extended Latin square matrix is generated as shown in Equation 5 above. According to embodiments, processing may be performed in a matrix unit rather than a row or column unit.

Thereafter, the procedure of FIG. 4 ends.

Now, an example of an extended Latin squared matrix will be described under the assumption that a parallel processing order is 4. First, a 4×4 reduced Latin square matrix having a parallel processing order L of 4 is expressed by Equation 6 below:

$$u_4 = \begin{bmatrix} a_{11} & a_{12} & a_{13} & a_{14} \\ a_{21} & a_{22} & a_{23} & a_{24} \\ a_{31} & a_{32} & a_{33} & a_{34} \\ a_{41} & a_{42} & a_{43} & a_{44} \end{bmatrix},\ u_4 = \begin{bmatrix} 0 & 1 & 2 & 3 \\ 2 & 3 & 0 & 1 \\ 3 & 0 & 1 & 2 \\ 1 & 2 & 3 & 0 \end{bmatrix}. \quad [\text{Eqn. 6}]$$

In Equation 6, $u_4$ has a reduced format in which a first row $(a_{11}\ a_{12}\ a_{13}\ a_{14})$ always has values of $(0\ 1\ 2\ 3)$. $u_4$ can be extended into $u_8$ by using Equation 5 above. The extended matrix $u_8$ is expressed by Equation 7 below:

$$u_8 = (u_4)^{(2)} \quad [\text{Eqn. 7}]$$

$$= \left( \begin{bmatrix} a_{11} & a_{12} & a_{13} & a_{14} \\ a_{21} & a_{22} & a_{23} & a_{24} \\ a_{31} & a_{32} & a_{33} & a_{34} \\ a_{41} & a_{42} & a_{43} & a_{44} \end{bmatrix} \right)^{(2)}$$

$$= \begin{bmatrix} a_{11} & a_{12} & a_{13} & a_{14} & a_{11}^{(1)} & a_{12}^{(1)} & a_{13}^{(1)} & a_{14}^{(1)} \\ a_{21}^{(1)} & a_{22}^{(1)} & a_{23}^{(1)} & a_{24}^{(1)} & a_{21} & a_{22} & a_{23} & a_{24} \\ a_{31} & a_{32} & a_{33} & a_{34} & a_{31}^{(1)} & a_{32}^{(1)} & a_{33}^{(1)} & a_{34}^{(1)} \\ a_{41}^{(1)} & a_{42}^{(1)} & a_{43}^{(1)} & a_{44}^{(1)} & a_{41} & a_{42} & a_{43} & a_{44} \\ a_{11}^{(1)} & a_{12}^{(1)} & a_{13}^{(1)} & a_{14}^{(1)} & a_{11} & a_{12} & a_{13} & a_{14} \\ a_{21} & a_{22} & a_{23} & a_{24} & a_{21}^{(1)} & a_{22}^{(1)} & a_{23}^{(1)} & a_{24}^{(1)} \\ a_{31}^{(1)} & a_{32}^{(1)} & a_{33}^{(1)} & a_{34}^{(1)} & a_{31} & a_{32} & a_{33} & a_{34} \\ a_{41} & a_{42} & a_{43} & a_{44} & a_{41}^{(1)} & a_{42}^{(1)} & a_{43}^{(1)} & a_{44}^{(1)} \end{bmatrix}$$

$$u_8 = \left( \begin{bmatrix} 0 & 1 & 2 & 3 \\ 2 & 3 & 0 & 1 \\ 3 & 0 & 1 & 2 \\ 1 & 2 & 3 & 0 \end{bmatrix} \right)^{2}$$

$$= \begin{bmatrix} 0 & 1 & 2 & 3 & 4 & 5 & 6 & 7 \\ 5 & 6 & 7 & 4 & 1 & 2 & 3 & 0 \\ 3 & 0 & 1 & 2 & 7 & 4 & 5 & 6 \\ 6 & 7 & 4 & 5 & 2 & 3 & 0 & 1 \\ 4 & 5 & 6 & 7 & 0 & 1 & 2 & 3 \\ 1 & 2 & 3 & 0 & 5 & 6 & 7 & 0 \\ 7 & 4 & 5 & 6 & 3 & 0 & 1 & 2 \\ 2 & 3 & 0 & 1 & 6 & 7 & 4 & 5 \end{bmatrix}.$$

In Equation 7, a first column $(a_{11}\ a_{12}\ a_{13}\ a_{14}\ a_{11}^{(1)}\ a_{12}^{(1)}\ a_{13}^{(1)}\ a_{14}^{(1)})$ of $u_8$ is $(0\ 1\ 2\ 3\ 4(a_{11}^{(1)}=a_{11}+k*1=0+1*4)\ 5(a_{12}^{(1)}=a12+k*1=1+1*4)\ 6(a_{13}^{(1)}=a_{13}+k*1=2+1*4)\ 7(a_{14}^{(1)}=a_{14}+k*1=3+1*4))=(0\ 1\ 2\ 3\ 4\ 5\ 6\ 7)$. A second column $(a_{12}^{(1)}\ a_{22}^{(1)}\ a_{23}^{(1)}\ a_{24}^{(1)}\ a_{21}\ a_{22}\ a_{23}\ a_{24})$ of $u_8$ is $(5(a_{21}^{(1)}=a_{21}+k*1=2+1*4)\ 6(a_{22}^{(1)}=a_{22}^{(1)}=a_{22}+k*1=2+1*4)\ 7(a_{23}^{(1)}=a_{23}+k*1=3+1*4)\ 4(a_{24}^{(1)}=a_{24}+k*1=0+1*4)\ 1\ 2\ 3\ 0)=(5\ 6\ 7\ 4\ 1\ 2\ 3\ 0)$. In this manner, elements of the remaining columns can be calculated.

If n=3, $u_4$ is extended by Equation 8 below:

$$u_{12} = (u_4)^{(3)} \quad [\text{Eqn. 8}]$$

$$= \left( \begin{bmatrix} a_{11} & a_{12} & a_{13} & a_{14} \\ a_{21} & a_{22} & a_{23} & a_{24} \\ a_{31} & a_{32} & a_{33} & a_{34} \\ a_{41} & a_{42} & a_{43} & a_{44} \end{bmatrix} \right)^{(3)}$$

$$= \begin{bmatrix} a_{11} & a_{12} & a_{13} & a_{14} & a_{11}^{(1)} & a_{12}^{(1)} & a_{13}^{(1)} & a_{14}^{(1)} & a_{11}^{(2)} & a_{12}^{(2)} & a_{13}^{(2)} & a_{14}^{(2)} \\ a_{21}^{(2)} & a_{22}^{(2)} & a_{23}^{(2)} & a_{24}^{(2)} & a_{21} & a_{22} & a_{23} & a_{24} & a_{21}^{(1)} & a_{22}^{(1)} & a_{23}^{(1)} & a_{24}^{(1)} \\ a_{31}^{(1)} & a_{32}^{(1)} & a_{33}^{(1)} & a_{34}^{(1)} & a_{31}^{(2)} & a_{32}^{(2)} & a_{33}^{(2)} & a_{34}^{(2)} & a_{31} & a_{32} & a_{33} & a_{34} \\ a_{41} & a_{42} & a_{43} & a_{44} & a_{41}^{(1)} & a_{42}^{(1)} & a_{43}^{(1)} & a_{44}^{(1)} & a_{41}^{(2)} & a_{42}^{(2)} & a_{43}^{(2)} & a_{44}^{(2)} \\ a_{11}^{(1)} & a_{12}^{(1)} & a_{13}^{(1)} & a_{14}^{(1)} & a_{11}^{(2)} & a_{12}^{(2)} & a_{13}^{(2)} & a_{14}^{(2)} & a_{11} & a_{12} & a_{13} & a_{14} \\ a_{21} & a_{22} & a_{23} & a_{24} & a_{21}^{(1)} & a_{22}^{(1)} & a_{23}^{(1)} & a_{24}^{(1)} & a_{21}^{(2)} & a_{22}^{(2)} & a_{23}^{(2)} & a_{24}^{(2)} \\ a_{31}^{(2)} & a_{32}^{(2)} & a_{33}^{(2)} & a_{34}^{(2)} & a_{31} & a_{32} & a_{33} & a_{34} & a_{31}^{(1)} & a_{32}^{(1)} & a_{33}^{(1)} & a_{34}^{(1)} \\ a_{41}^{(1)} & a_{42}^{(1)} & a_{43}^{(1)} & a_{44}^{(1)} & a_{41}^{(2)} & a_{42}^{(2)} & a_{43}^{(2)} & a_{44}^{(2)} & a_{41} & a_{42} & a_{43} & a_{44} \\ a_{11}^{(2)} & a_{12}^{(2)} & a_{13}^{(2)} & a_{14}^{(2)} & a_{11} & a_{12} & a_{13} & a_{14} & a_{11}^{(1)} & a_{12}^{(1)} & a_{13}^{(1)} & a_{14}^{(1)} \\ a_{21}^{(1)} & a_{22}^{(1)} & a_{23}^{(1)} & a_{24}^{(1)} & a_{21}^{(2)} & a_{22}^{(2)} & a_{23}^{(2)} & a_{24}^{(2)} & a_{21} & a_{22} & a_{23} & a_{24} \\ a_{31} & a_{32} & a_{33} & a_{34} & a_{31}^{(1)} & a_{32}^{(1)} & a_{33}^{(1)} & a_{34}^{(1)} & a_{31}^{(2)} & a_{32}^{(2)} & a_{33}^{(2)} & a_{34}^{(2)} \\ a_{41}^{(2)} & a_{42}^{(2)} & a_{43}^{(2)} & a_{44}^{(2)} & a_{41} & a_{42} & a_{43} & a_{44} & a_{41}^{(1)} & a_{42}^{(1)} & a_{43}^{(1)} & a_{44}^{(1)} \end{bmatrix}$$

There are a total of 24 cases for $u_4$ having a reduced format defined by Equation 6. In addition, there are also a total of 24 cases for $u_8$ of Equation 7 and $u_{12}$ of Equation 8. Therefore, the number of cases to be considered for optimization of interleaving is determined to be small according to the reduced Latin square matrix irrespective of the parallel processing order.

FIG. 5 is a block diagram illustrating an apparatus for performing parallel structured interleaving according to an exemplary embodiment of the present invention.

Referring to FIG. 5, a fill data block is divided into a plurality of sub-blocks according to a parallel processing order L. Data information consists of the respective sub-blocks and is stored in each of memories 1 to L. A sub-block interleaver reads out the data information stored in each of the memories 1 to L according to an interleaving rule. The sub-block interleaver may be a conventional interleaver. A plurality of sub-block interleavers performs the same interleaving operation. Data information bits are mixed by the respective sub-block interleavers. Data is output by being combined between blocks by a Latin square interleaver.

According to the present invention, the Latin square interleaver is designed differently depending on the parallel processing order. In general, if the full data block length N has a small or medium size (about 2000 or below), a required parallel processing order is low. If the full data block length has a medium or large size (about 1000 or above), the required parallel processing order is high. That is, when the parallel processing order is low, the Latin square matrix is configured according to the conventional Latin square interleaving method. If the parallel processing order L required by the system is high, an L×L extended Latin square matrix is configured using an l×l reduced Latin square matrix. Herein, l is an integer less than L, where l is not relatively prime to L (i.e., L is a multiple of l). A method of configuring the L×L extended Latin square matrix by using the l×l reduced Latin square matrix has been described above in detail with reference to FIG. 4.

As such, the Latin square interleaver configures a Latin square matrix according to a parallel processing order (see Equation 7 and Equation 8), and then performs interleaving on data according to the configured Latin square matrix.

Figure 6:
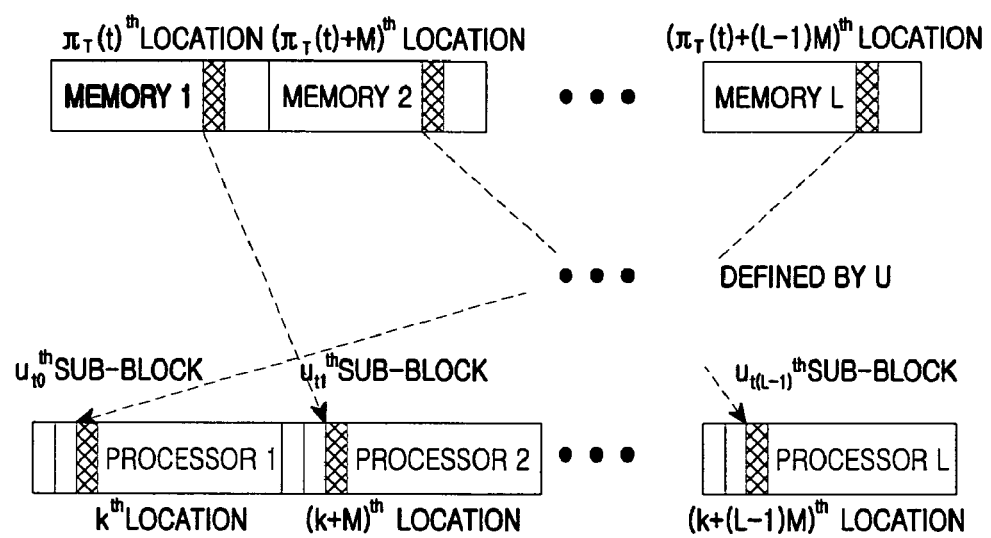
FIG. 6 is a diagram illustrating a process of performing Latin square interleaving according to an exemplary embodiment of the present invention.

The configured Latin square matrix generates an M×L matrix in an iterative format. An interleaver function is performed according to Equation 3. FIG. 6 is a diagram illustrating a process of performing Latin square interleaving defined by Equation 3. For example, when information is read from a memory at a $k^{th}$ location of a first processor 1, information at a $\pi_T(t)^{th}$ location of a $u_{r0}^{th}$ sub-block defined by the matrix U is read. When information is read from the memory at a $k^{th}$ location of a second processor 2, the information at the $\pi_T(t)^{th}$ location of a $u_{r1}^{th}$ sub-block is read. Likewise, L processors simultaneously read the information at the $\pi_T(t)^{th}$ location from the sub-block location defined by the matrix U. Thus, parallel processing is performed. A memory contention does not occur since the same sub-block index does not exist in one row or column according to characteristics of the Latin square matrix.

Figure 7A:
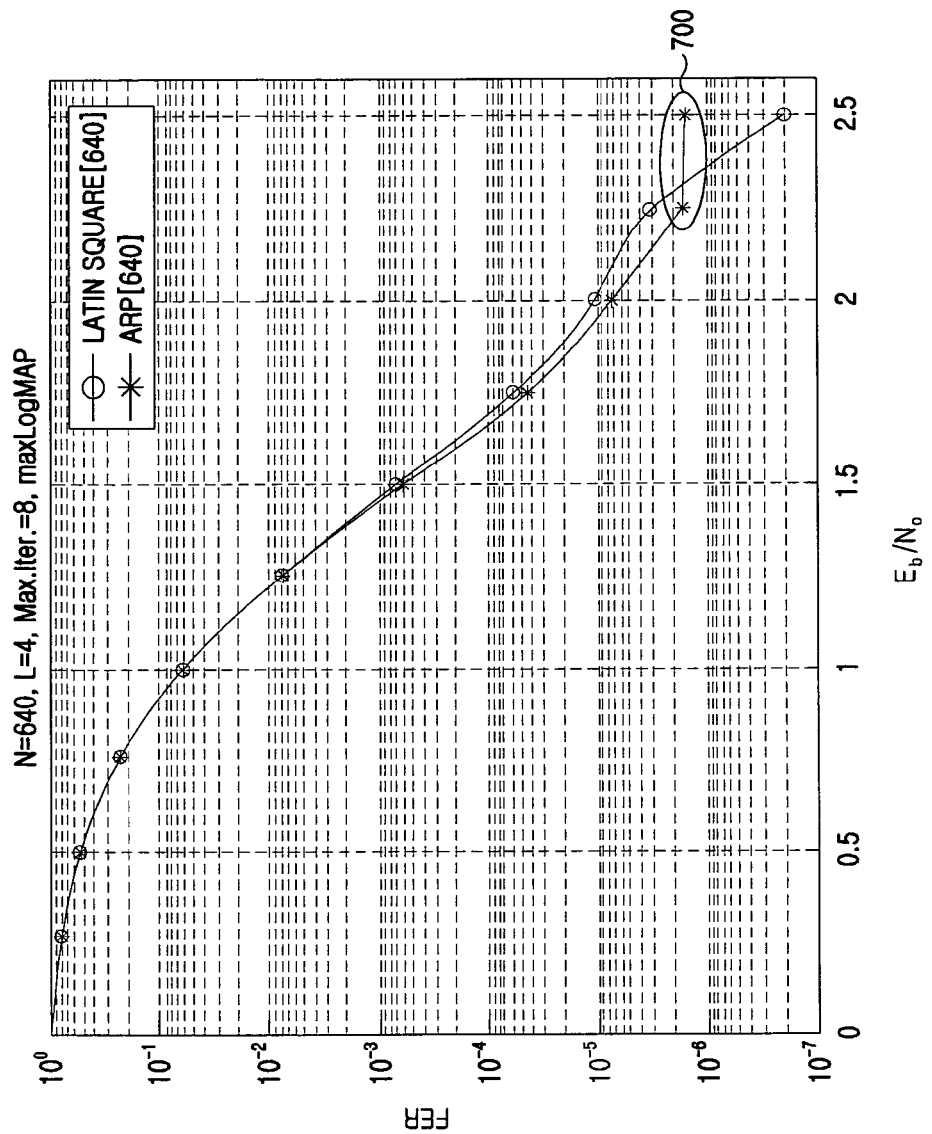
FIG. 7A is a graph illustrating a Frame Error Rate (FER) with respect to a signal to noise ratio (i.e., $E_b/N_o$) to compare a throughput of a Latin square interleaver and a throughput of an Almost Regular Permutation (ARP) interleaver when a parallel processing order is 4 and a full block length M is 640 according to an exemplary embodiment of the present invention.

FIG. 7A is a graph illustrating a Frame Error Rate (FER) with respect to a signal to noise ratio (i.e., $E_b/N_o$) to compare a throughput of a Latin square interleaver and a throughput of an Almost Regular Permutation (ARP) interleaver when a parallel processing order is 4 and a full block length M is 640 according to an exemplary embodiment of the present invention. Parameters of the ARP interleaver used herein are proposed by the 3GPP2 standard. The parameters of the ARP interleaver are expressed by Equation 9 below:

$$P=201, L=4, \alpha=(0,0,1,1), \beta=(0,6,3,1), \gamma=3. \quad [\text{Eqn. 9}]$$

For the Latin square interleaver, a 3GPP interleaver having a length of 160 is used as a sub-block interleaver. The Latin square interleaver has a format of Equation 10 below:

$$u^4 = \begin{bmatrix} 0 & 1 & 2 & 3 \\ 2 & 3 & 0 & 1 \\ 3 & 0 & 1 & 2 \\ 1 & 2 & 3 & 0 \end{bmatrix}. \quad [\text{Eqn. 10}]$$

A full coding rate is ⅓. An incident matrix of a configured convolution code is expressed by Equation 11 below. A max long-MAP is used as a decoding scheme. Decoding is repeated up to 8 times. The decoding is finished when no error is detected from a decoded bit in the decoding process.

$$g(D) = \begin{bmatrix} 1 & \dfrac{1+D+D^3}{1+D^2+D^3} \end{bmatrix}. \quad [\text{Eqn. 11}]$$

Referring to FIG. 7A, the Latin square interleaver and the ARP interleaver show similar throughputs until the $E_b/N_o$ reaches approximately 1.5 dB. After 1.5 dB, the ARP interleaver shows a slightly better throughput. After the $E_b/N_o$ reaches approximately 2.25 dB, the throughput of the ARP interleaver is almost constant even if the $E_b/N_o$ increases. However, the Latin square interleaver shows an excellent throughput even if the $E_b/N_o$ is high, which is indicated by 700 in FIG. 7A.

Figure 7B:
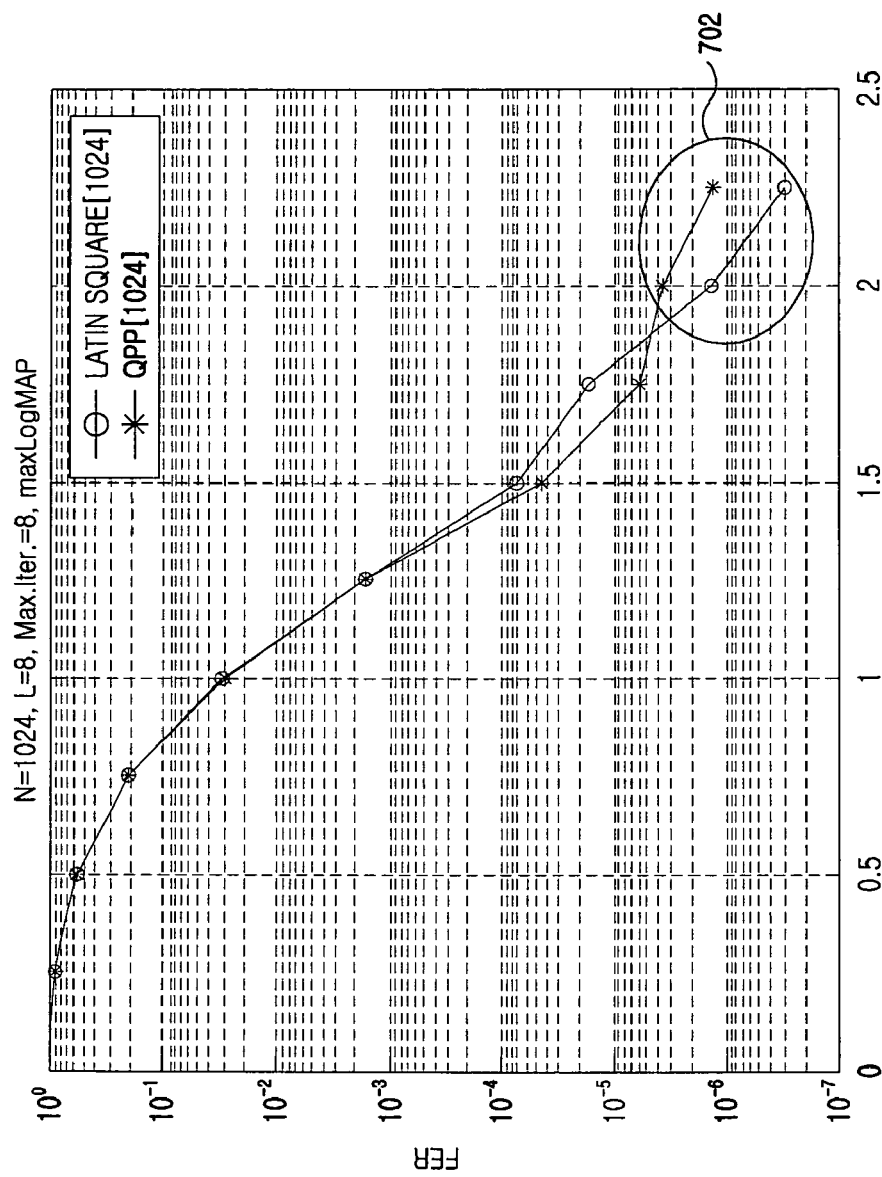
FIG. 7B is a graph illustrating an FER with respect to an $E_b/N_o$ to compare a throughput of a Latin square interleaver and a throughput of a Quadratic Permutation Polynomial (QPP) interleaver when a parallel processing order is 8 and a full block length M is 1024 according to an exemplary embodiment of the present invention.

FIG. 7B is a graph illustrating an FER with respect to an $E_b/N_o$ to compare a throughput of a Latin square interleaver and a throughput of a Quadratic Permutation Polynomial (QPP) interleaver when a parallel processing order is 8 and a full block length M is 1024 according to an exemplary embodiment of the present invention. The parameters of the QPP interleaver are expressed by Equation 12 below:

$$f_1=31, f_2=64. \quad [\text{Eqn. 12}]$$

For the Latin square interleaver, a 3GPP interleaver having a length of 128 is used as a sub-block interleaver. The Latin square interleaver has a format of Equation 13 below:

$$u_8 = \begin{pmatrix} \begin{bmatrix} 0 & 1 & 2 & 3 \\ 2 & 3 & 0 & 1 \\ 3 & 0 & 1 & 2 \\ 1 & 2 & 3 & 0 \end{bmatrix} \end{pmatrix}^2 \quad [\text{Eqn. 13}]$$

$$= \begin{bmatrix} 0 & 1 & 2 & 3 & 4 & 5 & 6 & 7 \\ 5 & 6 & 7 & 4 & 1 & 2 & 3 & 0 \\ 3 & 0 & 1 & 2 & 7 & 4 & 5 & 6 \\ 6 & 7 & 4 & 5 & 2 & 3 & 0 & 1 \\ 4 & 5 & 6 & 7 & 0 & 1 & 2 & 3 \\ 1 & 2 & 3 & 0 & 5 & 6 & 7 & 0 \\ 7 & 4 & 5 & 6 & 3 & 0 & 1 & 2 \\ 2 & 3 & 0 & 1 & 6 & 7 & 4 & 5 \end{bmatrix}.$$

Other simulation conditions are similar to those of FIG. 7A. The two interleavers show the almost same throughputs until the $E_b/N_o$ reaches approximately 1.25 dB. After 1.25 dB, the QPP interleaver shows a better throughput until the $E_b/N_o$ reaches approximately 1.8 dB. However, the throughput of QPP interleaver shows less improvement even if the $E_b/N_o$ increases. Similarly to the APP interleaver, the proposed Latin square interleaver shows an excellent throughput even if the $E_b/N_o$ is high, which is indicated by 702 in FIG. 7B.

As described above, a communication system of the present invention performs interleaving by configuring a Latin square interleaver according to a parallel processing order. Therefore, there is an advantage in that the number of cases to be considered for optimization of the interleaver is significantly smaller than other interleavers. Further, the proposed interleaver shows a throughput almost the same as that of other contention-free interleavers. In particular, a throughput (i.e., FER) is improved at a high signal to noise ratio (i.e., $E_b/N_o$). Furthermore, any type of conventional interleavers can be used as a sub-block interleaver.

While the present invention has been shown and described with reference to certain exemplary embodiments thereof, it will be understood by those skilled in the art that various changes in form and details may be made therein without departing from the spirit and scope of the present invention as defined by the appended claims and their equivalents. Therefore, the scope of the invention is defined not by the detailed description of the invention but by the appended claims and their equivalents, and all differences within the scope will be construed as being included in the present invention.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for encoding data using a parallel structured Latin square matrix in a communication system, the method comprising:
   dividing input information bits into a plurality of sub-blocks according to a parallel processing order;
   generating one of a first Latin square matrix and a second Latin square matrix based on a result of comparing a size of the parallel processing order with a predetermined threshold; and
   interleaving the input information bits divided into the sub-blocks according to the generated Latin square matrix; and
   transmitting the interleaved input information bits.

2. The interleaving method of claim 1, wherein if the parallel processing order is less than the threshold, generating the first Latin square matrix having a size of the parallel processing order and having a distribution.

3. The interleaving method of claim 1, wherein if the parallel processing order is greater than the threshold, generating a Latin square matrix having a size of a predetermined order less than the parallel processing order and generating the second Latin square matrix extended by the size of the parallel processing order from the Latin square matrix.

4. The interleaving method of claim 3, wherein the predetermined order size l is a constant less than the parallel processing order L, where L is a multiple of l.

5. The interleaving method of claim 3, wherein the second Latin square matrix is expressed by:

$$u_L = (u_l)^{(n)}$$

$$= \left( \begin{bmatrix} a_{11} & a_{12} & \cdots & a_{1l} \\ a_{21} & a_{22} & & a_{2l} \\ \vdots & & \ddots & \vdots \\ a_{l1} & a_{l2} & \cdots & a_{ll} \end{bmatrix} \right)^{(n)}$$

$$= \begin{bmatrix} a_{11} & \cdots & a_{1l} & a_{11}^{(1)} & \cdots & a_{1l}^{(1)} & \cdots & a_{11}^{(n-1)} & \cdots & a_{1l}^{(n-1)} \\ a_{21}^{(n-1)} & \cdots & a_{2l}^{(n-1)} & a_{21} & \cdots & a_{2l} & \cdots & a_{21}^{(n-2)} & \cdots & a_{2l}^{(n-2)} \\ \vdots & & \vdots & \vdots & & \vdots & \ddots & \vdots & & \vdots \\ a_{11}^{(1)} & \cdots & a_{1l}^{(1)} & a_{11}^{(2)} & \cdots & a_{1l}^{(2)} & \cdots & a_{11} & \cdots & a_{1l} \\ a_{21} & \cdots & a_{2l} & a_{21}^{(1)} & \cdots & a_{2l}^{(1)} & \cdots & a_{21}^{(n-1)} & \cdots & a_{2l}^{(n-1)} \\ \vdots & & \vdots & \vdots & & \vdots & \ddots & \vdots & & \vdots \\ \vdots & & \vdots & \vdots & & \vdots & \ddots & \vdots & & \vdots \\ a_{11}^{(n-1)} & \cdots & a_{1l}^{(n-1)} & a_{11} & \cdots & a_{1l} & \cdots & a_{11}^{(n-2)} & \cdots & a_{1l}^{(n-2)} \\ a_{21}^{(n-2)} & \cdots & a_{2l}^{(n-2)} & a_{21}^{(n-1)} & \cdots & a_{2l}^{(n-1)} & \cdots & a_{21}^{(n-3)} & \cdots & a_{2l}^{(n-3)} \\ \vdots & & \vdots & \vdots & & \vdots & \ddots & \vdots & & \vdots \end{bmatrix}$$

where $u_L$ denotes the second Latin matrix having a size of L×L, $u_l$ denotes a Latin square matrix having a size of l×l, and n denotes a parameter for converting the Latin square matrix $u_l$ into the Latin square matrix $u_L$ having a size required by the system.

6. The interleaving method of claim 5, wherein an element $a_{i,j}^{(k)}$ of the second Latin square matrix is calculated according to:

$$a_{ij}^{(k)} = a_{ij} + l \cdot k, \quad 0 \leq k \leq n-1,$$

where $a_{i,j}^{(k)}$ denotes an element of the second Latin square matrix, $a_{i,j}$ denotes an element of an $i^{th}$ row and an $j^{th}$ column of the reduced Latin square matrix $u_l$, l denotes a predetermined order size, i denotes a sub-block index, and j denotes a time-domain index.

7. The interleaving method of claim 1, wherein interleaving the information bits divided into the sub-blocks according to the generated Latin square matrix further comprises:
   determining an information bit permutation such that a memory contention does not occur.

8. The interleaving method of claim 7, wherein the information bit permutation is determined according to:

$$\pi(k) = u_{ij} \cdot M + \pi_T(t), \quad k = j \times M + i,$$

wherein $\pi(k)$ denotes an interleaving rule of an interleaver, $\pi_T(t)$ denotes a conventional sub-block interleaver, $u_{ij}$ denotes an element of an $i^{th}$ row and an $j^{th}$ column of the second Latin square matrix U, and M denotes a sub-block size.

9. The interleaving method of claim 1, wherein interleaving using the parallel structured Latin square matrix is based on parallel processing of a turbo code.

10. The interleaving method of claim 1 further comprising:
    generating the first Latin square matrix by one of:
    associating a number of sub-blocks with a number of columns in the first Latin square matrix and a number of bits for each sub-block with a number of rows in the first Latin square matrix, and
    associating a number of sub-blocks with a number of rows in the first Latin square matrix and a number of bits for each sub-block with a number of columns in the first Latin square matrix.

11. An interleaving apparatus for encoding data using a parallel structured Latin square matrix in a communication system, the apparatus comprising:
    a sub-block interleaver configured to divide input information bits into a plurality of sub-blocks according to a parallel processing order; and
    a Latin square interleaver configured to generate one of a first Latin square matrix and a second Latin square matrix based on a result of comparing a size of the parallel processing order with a predetermined threshold, and interleave the input information bits divided into the sub-blocks according to the generated Latin square matrix.

12. The interleaving apparatus of claim 11, wherein, if the parallel processing order is less than the threshold, the Latin square interleaver is further configured to generate a first Latin square matrix having a size of the parallel processing order and having a distribution.

13. The interleaving apparatus of claim 11, wherein if the parallel processing order is greater than the threshold, the Latin square interleaver is further configured to generate a Latin square matrix having a size of a predetermined order less than the parallel processing order and generate the second Latin square matrix extended by the size of the parallel processing order from the Latin square matrix.

14. The interleaving apparatus of claim 13, wherein the preset order size l is a constant less than the parallel processing order L, where L is a multiple of l.

15. The interleaving apparatus of claim 13, wherein the second Latin square matrix is expressed by:

$$u_L = (u_l)^{(n)}$$

$$= \left( \begin{bmatrix} a_{11} & a_{12} & \cdots & a_{1l} \\ a_{21} & a_{22} & & a_{2l} \\ \vdots & & \ddots & \vdots \\ a_{l1} & a_{l2} & \cdots & a_{ll} \end{bmatrix} \right)^{(n)}$$

$$= \begin{bmatrix} a_{11} & \cdots & a_{1l} & a_{11}^{(1)} & \cdots & a_{1l}^{(1)} & \cdots & a_{11}^{(n-1)} & \cdots & a_{1l}^{(n-1)} \\ a_{21}^{(n-1)} & \cdots & a_{2l}^{(n-1)} & a_{21} & \cdots & a_{2l} & \cdots & a_{21}^{(n-2)} & \cdots & a_{2l}^{(n-2)} \\ \vdots & & \vdots & \vdots & & \vdots & \ddots & \vdots & & \vdots \\ a_{11}^{(1)} & \cdots & a_{1l}^{(1)} & a_{11}^{(2)} & \cdots & a_{1l}^{(2)} & \cdots & a_{11} & \cdots & a_{1l} \\ a_{21} & \cdots & a_{2l} & a_{21}^{(1)} & \cdots & a_{2l}^{(1)} & \cdots & a_{21}^{(n-1)} & \cdots & a_{2l}^{(n-1)} \\ \vdots & & \vdots & \vdots & & \vdots & \ddots & \vdots & & \vdots \\ \vdots & & \vdots & \vdots & & \vdots & \ddots & \vdots & & \vdots \\ a_{11}^{(n-1)} & \cdots & a_{1l}^{(n-1)} & a_{11} & \cdots & a_{1l} & \cdots & a_{11}^{(n-2)} & \cdots & a_{1l}^{(n-2)} \\ a_{21}^{(n-2)} & \cdots & a_{2l}^{(n-2)} & a_{21}^{(n-1)} & \cdots & a_{2l}^{(n-1)} & \cdots & a_{21}^{(n-3)} & \cdots & a_{2l}^{(n-3)} \\ \vdots & & \vdots & \vdots & & \vdots & \ddots & \vdots & & \vdots \end{bmatrix}$$

where $u_L$ denotes the second Latin matrix having a size of L×L, $u_l$ denotes a Latin square matrix having a size of l×l, and n denotes a parameter for converting the Latin square matrix $u_l$ into the Latin square matrix $u_L$ having a size required by the system.

16. The interleaving apparatus of claim 15, wherein an element $a_{i,j}^{(k)}$ of the second Latin square matrix is calculated according to:

$$a_{ij}^{(k)} = a_{ij} + l \cdot k, \ 0 \leq k \leq n-1,$$

where $a_{i,j}^{(k)}$ denotes an element of the second Latin square matrix, $a_{i,j}$ denotes an element of an $i^{th}$ row and an $j^{th}$ column of the reduced Latin square matrix $u_l$, l denotes a predetermined order size, i denotes a sub-block index, and j denotes a time-domain index.

17. The interleaving apparatus of claim 11, wherein when the Latin square interleaver is further configured to determine an information bit permutation such that a memory contention does not occur.

18. The interleaving apparatus of claim 17, wherein the information bit permutation is determined according to:

$$\pi(k) = u_{ij} \cdot M + \pi_T(t), \ k = j \times M + i,$$

wherein $\pi(k)$ denotes an interleaving rule of an interleaver, $\pi_T(t)$ denotes a conventional sub-block interleaver, $u_{ij}$ denotes an element of an $i^{th}$ row and an $j^{th}$ column of the second Latin square matrix U, and M denotes a sub-block size.

19. The interleaving apparatus of claim 11, wherein the interleaving using the parallel structured Latin square matrix is based on parallel processing of a turbo code.

20. The interleaving apparatus of claim 11, wherein the Latin square interleaver is further configured to generate the first Latin square matrix by one of:

associating a number of sub-blocks with a number of columns in the first Latin square matrix and a number of bits for each sub-block with a number of rows in the first Latin square matrix, and associating a number of sub-blocks with a number of rows in the first Latin square matrix and a number of bits for each sub-block with a number of columns in the first Latin square matrix.

\* \* \* \* \*